United States Patent
Shin et al.

(10) Patent No.: US 11,443,815 B2
(45) Date of Patent: Sep. 13, 2022

(54) MEMORY DEVICE AND OPERATING METHOD THEREOF

(71) Applicant: SK hynix Inc., Gyeonggi-do (KR)

(72) Inventors: Jae Hyeon Shin, Gyeonggi-do (KR); Gwi Han Ko, Gyeonggi-do (KR); Sung Hun Kim, Gyeonggi-do (KR); Gwan Park, Gyeonggi-do (KR); Hyun Soo Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 104 days.

(21) Appl. No.: 17/145,828

(22) Filed: Jan. 11, 2021

(65) Prior Publication Data

US 2022/0028462 A1 Jan. 27, 2022

(30) Foreign Application Priority Data

Jul. 24, 2020 (KR) .................. 10-2020-0092330

(51) Int. Cl.
*G11C 16/26* (2006.01)
*G11C 16/10* (2006.01)
*G11C 16/04* (2006.01)
*G11C 16/08* (2006.01)
*G11C 16/24* (2006.01)
*G11C 16/30* (2006.01)

(52) U.S. Cl.
CPC .......... *G11C 16/26* (2013.01); *G11C 16/0425* (2013.01); *G11C 16/08* (2013.01); *G11C 16/10* (2013.01); *G11C 16/24* (2013.01); *G11C 16/30* (2013.01)

(58) Field of Classification Search
CPC ...................................... G11C 16/26
See application file for complete search history.

(56) References Cited

U.S. PATENT DOCUMENTS

2009/0122592 A1* 5/2009 Tokiwa .................. G11C 13/00
  365/175
2016/0099068 A1* 4/2016 Kwak .................... G11C 16/14
  365/185.25
2021/0391027 A1* 12/2021 Hsu ..................... G11C 16/0483

FOREIGN PATENT DOCUMENTS

KR 10-2018-0080003 7/2018
KR 10-2058664 12/2019

* cited by examiner

*Primary Examiner* — Douglas King
(74) *Attorney, Agent, or Firm* — IP & T Group LLP

(57) ABSTRACT

A memory device may include a first sub-block and a second sub-block each including a plurality of select transistors and a plurality of memory cells, a peripheral circuit performing a read operation on data stored in the first sub-block, and a control logic controlling the peripheral circuit to turn on the plurality of select transistors included in each of the first and second sub-blocks and apply a read voltage to a selected word line among a plurality of word lines.

20 Claims, 11 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2020-0092330, filed on Jul. 24, 2020, in the Korean Intellectual Property Office, the entire disclosure of which is incorporated by reference herein.

BACKGROUND

1. Technical Field

Various embodiments relate generally to an electronic device, and more particularly, to a memory device and a method of operating the memory device.

2. Related Art

A storage device is configured to store data in response to control of a host device such as a computer or a smartphone. The storage device may include a memory device storing data and a memory controller controlling the memory device. Generally, there are two types of memory devices: volatile memory devices and non-volatile memory devices.

A volatile memory device may retain data as long as power is being supplied, and may lose the stored data in the absence of power supply. Examples of volatile memory devices include Static Random Access Memory (SRAM), Dynamic Random Access Memory (DRAM), and the like.

A non-volatile memory device may not lose data even in the absence of power supply. Examples of non-volatile memory devices include Read Only Memory (ROM), Programmable ROM (PROM), Electrically Programmable ROM (EPROM), Electrically Erasable and Programmable ROM (EEPROM) and flash memory.

Three-dimensional memory devices have been developed to increase integration density of the memory device. Due to the structural differences between three-dimensional memory devices and two-dimensional memory devices, various driving methods for driving three-dimensional memory devices have been researched.

SUMMARY

Various embodiments of the present disclosure are directed to a memory device having improved read operation characteristics and a method of operating the memory device.

According to an embodiment, a memory device may include a first sub-block including a plurality of first select transistors and a plurality of first memory cells, a second sub-block coupled to the first sub-block through a plurality of word lines and including a plurality of second select transistors and a plurality of second memory cells, a peripheral circuit performing a read operation on data stored in the first sub-block or the second sub-block, and a control logic controlling the peripheral circuit to apply a read voltage to a selected word line among the plurality of word lines, wherein when the read operation is performed on the first sub-block, the control logic controls the peripheral circuit to: turn on the plurality of first select transistors and the plurality of second select transistors, and increase a voltage level of the plurality of word lines from a first level to a second level, turn off the plurality of second select transistors when the voltage level of the plurality of word lines reaches the second level, and increase the voltage level of the plurality of word lines from the second level to a third level.

According to an embodiment, a method of operating a memory device including a first sub-block including a plurality of first select transistors and a plurality of first memory cells, and a second sub-block coupled to the first sub-block through a plurality of word lines and including a plurality of second select transistors and a plurality of second memory cells, the memory device performing a read operation on the first sub-block may include turning on the plurality of first select transistors and the plurality of second select transistors, increasing a voltage level of the plurality of word lines from a first level to a second level, turning off the plurality of second select transistors, and increasing the voltage level of the plurality of word lines from the second level to a third level.

According to an embodiment, a memory device may include a first sub-block including a plurality of first select transistors and a plurality of first memory cells, a second sub-block coupled to the first sub-block through a plurality of word lines and including a plurality of second select transistors and a plurality of second memory cells, and a peripheral circuit performing a read operation on data stored in the first sub-block or the second sub-block, wherein, in performing the read operation, the peripheral circuit turns on the plurality of first select transistors and the plurality of second select transistors, increases a voltage level of the plurality of word lines in stepwise increments including at least two stepped increases, and turns off the plurality of second select transistors when the voltage level of the plurality of word lines reaches a target voltage level.

According to an embodiment, a memory device may include at least one first select transistor coupled to a first memory cell string in a first sub block, at least one second select transistor coupled to a second memory cell string in a second sub block, word lines coupled to memory cells of the first and second strings, respectively, and a control circuit configured to sequentially, turn on the first and second transistors, increase stepwise voltage levels of the word lines to a target level, turn off the at least one second transistor, and increase stepwise the voltage levels to a set level for reading data from the first string.

DETAILED DESCRIPTION

Specific structural and functional description provided herein is directed to embodiments of the disclosure. The present invention, however, may be configured in various other forms and/or carried out in various other ways. Thus, the present invention is not limited to or by any of the disclosed embodiments nor to any specific detail herein. Also, throughout the specification, reference to "an embodiment," "another embodiment" or the like is not necessarily to only one embodiment, and different references to any such phrase are not necessarily to the same embodiment(s).

Figure 1:
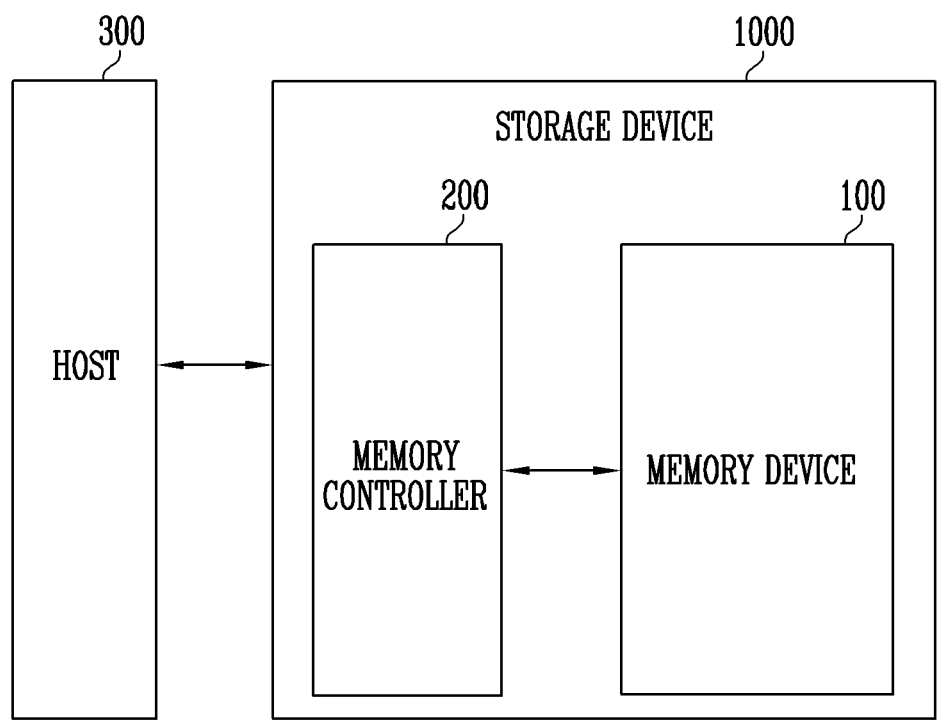
FIG. 1 is a block diagram illustrating a memory system according to an embodiment of the present disclosure.

FIG. 1 is a block diagram illustrating a memory system according to an embodiment of the present disclosure.

FIG. 1 illustrates a host 300 and a storage device 1000. The storage device 1000 may include a memory device 100 and a memory controller 200.

The storage device 1000 may be configured to store data in response to control of the host 300. Examples of the storage device 1000 include a cellular phone, a smartphone, an MP3 player, a laptop computer, a desktop computer, a game player, a display device, a tablet PC, and an in-vehicle infotainment system.

The storage device 1000 may be manufactured or configured as any of various types of storage devices according to a host interface corresponding to a communication method with the host 300. For example, the storage device 1000 may be configured as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, and/or a memory stick.

The storage device 1000 may be manufactured as any of various types of packages. For example, the storage device 1000 may be manufactured as a package-on-package (POP), a system-in-package (SIP), a system-on-chip (SOC), a multi-chip package (MCP), a chip-on-board (COB), a wafer-level fabricated package (WFP), and/or a wafer-level stack package (WSP).

The memory device 100 may store data or utilize stored data. More specifically, the memory device 100 may operate in response to control of the memory controller 200. In addition, the memory device 100 may include a plurality of memory dies, each of which may include a memory cell array including a plurality of memory cells storing data.

Each of the memory cells may be a single level cell (SLC) storing one data bit, a multi-level cell (MLC) storing two data bits, a triple level cell (TLC) storing three data bits, or a quad level cell (QLC) storing four data bits.

A memory cell array 110 may include a plurality of memory blocks. Each of the memory blocks may include a plurality of memory cells. One memory block may include a plurality of pages. A page may be a unit for storing data in the memory device 100, or a unit for reading data stored in the memory device 100.

Examples of the memory device 100 include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), NAND flash memory, vertical NAND flash memory, NOR flash memory, resistive random access memory (RRAM), phase-change random access memory (PRAM), magnetoresistive random access memory (MRAM), ferroelectric random access memory (FRAM), and spin transfer torque random access memory (STT-RAM). In the context of the description below, by way of example, the memory device 100 is a NAND flash memory.

The memory device 100 may receive a command and an address from the memory controller 200. The memory device 100 may be configured to access an area selected in response to the received address in the memory cell array. When the memory device 100 accesses the selected area, the memory device 100 may perform an operation corresponding to the received command on the selected area. For example, the memory device 100 may perform a write operation (program operation), a read operation, and an erase operation. In a program operation, the memory device 100 writes data into the area selected by the address. In a read operation, the memory device 100 reads data from the area selected by the address. In an erase operation, the memory device 100 erases the data stored in the area selected by the address.

The memory controller 200 may execute firmware FW when power is applied to the storage device 1000. The firmware FW may include a host interface layer (HIL) receiving a request input from the host 300 or outputting a response to the host 300, a flash translation layer (FTL) managing operations between an interface of the host 300 and an interface of the memory device 100, and a flash interface layer (FIL) providing a command to the memory device 100 or receiving a response from the memory device 100.

The memory controller 200 may receive data and a logical address LA from the host 300 and convert the logical address LA into a physical address PA indicating an address of memory cells in which the data in the memory device 100 is stored. The logical address LA may be a logical block address LBA and the physical address PA may be a physical block address PBA.

The memory controller 200 may control the memory device 100 to perform a program operation, a read operation or an erase operation in response to a request from the host 300. During a program operation, the memory controller 200 may provide a program command, a physical block address, and data to the memory device 100. During a read operation, the memory controller 200 may provide a read command and a physical block address to the memory device 100. During an erase operation, the memory controller 200 may provide an erase command and a physical block address to the memory device 100.

The memory controller 200 may control the memory device 100 to perform a program operation, a read operation or an erase operation in the absence of a request from the host 300. For example, the memory controller 200 may control the memory device 100 to perform a program operation, a read operation, or an erase operation used to perform background operations such as wear leveling, garbage collection and read reclaim.

The memory controller 200 may provide a cache program command to the memory device 100. When the memory device 100 receives the cache program command, control logic 130 may control a page buffer group 123 so that data to be programmed to the next page may be stored in the page buffer group 123 while the current page is being programmed with data.

The host 300 may communicate with the storage device 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC) of embedded MMC (eMMC), Dual In-line Memory Module (DIMM), Registered DIMM (RDIMM), and/or Load Reduced DIMM (LRDIMM) communication methods.

Figure 2:
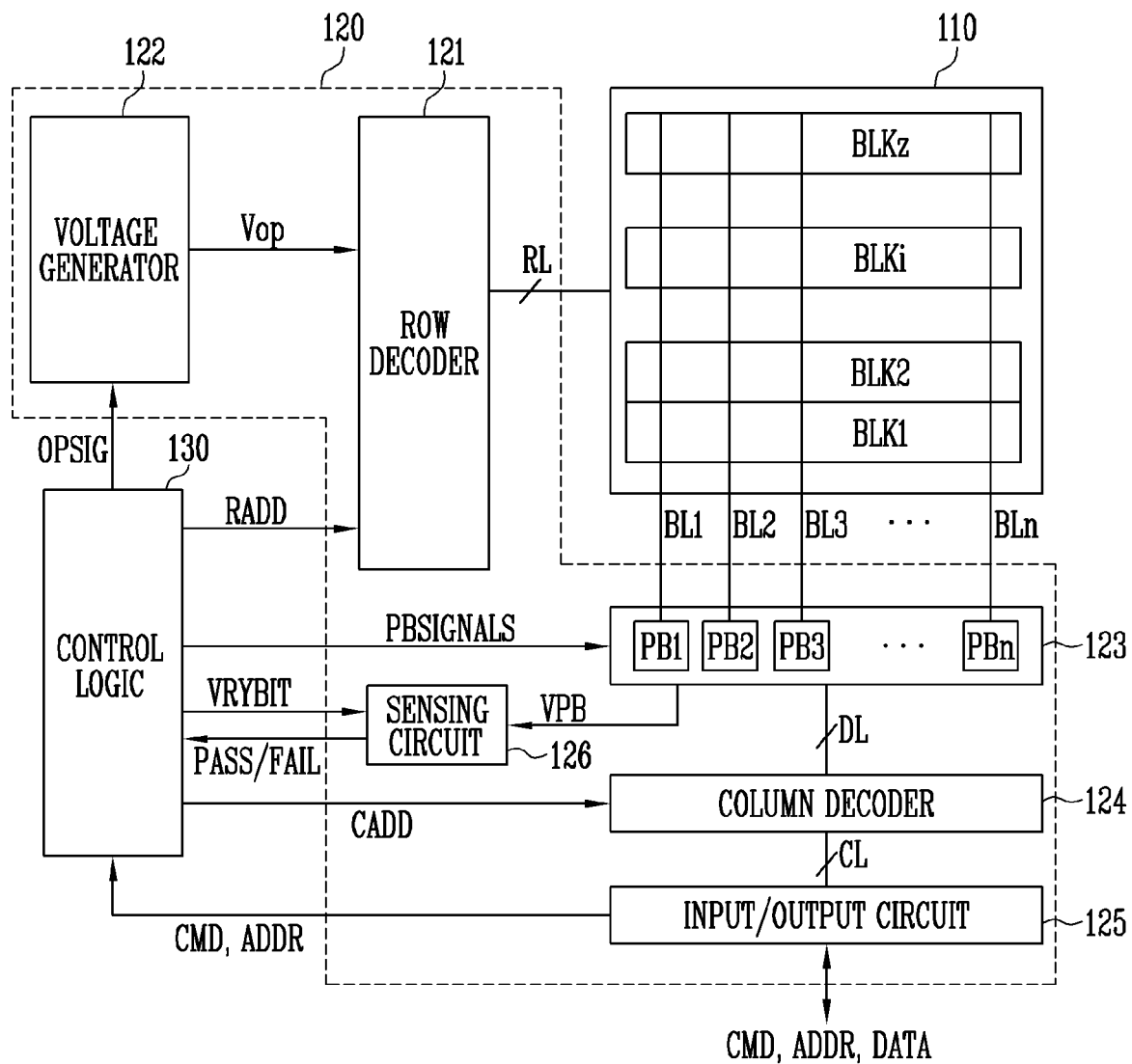
FIG. 2 is a block diagram illustrating a memory device according to an embodiment of the present disclosure.

FIG. 2 is a block diagram illustrating the memory device 100 according to an embodiment of the present disclosure.

Referring to FIG. 2, the memory device 100 may include the memory cell array 110, a peripheral circuit 120, and the control logic 130.

The memory cell array 110 includes a plurality of memory blocks BLK1 to BLKz, which may be coupled to a row decoder 121 through row lines RL. The row lines RL may include at least one source select line, a plurality of word lines, and at least one drain select line.

In addition, the plurality of memory blocks BLK1 to BLKz may be coupled to the page buffer group 123 through bit lines BL1 to BLn. Each of the plurality of memory blocks BLK1 to BLKz may include a plurality of memory cells. According to an embodiment, the plurality of memory cells may be non-volatile memory cells. A single unit for reading stored data, among memory cells coupled to the same word line, may be defined as one page. Therefore, each memory block may include a plurality of pages.

Each of the memory cells included in the memory cell array 110 may include a single-level cell (SLC) storing a single data bit, a multi-level cell (MLC) storing two data bits, a triple-level cell (TLC) storing three data bits, or a quad-level cell (QLC) storing four data bits.

The peripheral circuit 120 may be configured to perform a program, read or erase operation on a selected area of the memory cell array 110 in response to control of the control logic 130. In other words, the peripheral circuit 120 may drive the memory cell array 110 in response to the control logic 130. For example, the control logic 130 may control the peripheral circuit 120 to apply various operating voltages to the row lines RL and the bit lines BL1 to BLn, or to discharge the applied operating voltages.

More specifically, the peripheral circuit 120 may include the row decoder 121, a voltage generator 122, the page buffer group 123, a column decoder 124, and an input/output circuit 125.

The row decoder 121 may be coupled to the memory cell array 110 through the row lines RL. The row lines RL may include at least one source select line, a plurality of word lines, and at least one drain select line. According to an embodiment, the plurality of word lines may include a selected word line coupled to a plurality of memory cells which are subject to a read operation, and unselected word lines coupled to a plurality of memory cells which are not subject to the read operation. In addition, the row lines RL may further include a pipe select line.

The row decoder 121 may be configured to operate in response to control of the control logic 130. The row decoder 121 may receive a row address RADD from the control logic 130. More specifically, the row decoder 121 may be configured to decode the row address RADD. The row decoder 121 may select at least one memory block among the memory blocks BLK1 to BLKz according to the decoded address. The row decoder 121 may select at least one word line of the selected memory block so as to apply voltages generated by the voltage generator 122 to at least one word line WL according to the decoded address.

For example, during a program operation, the row decoder 121 may apply a program voltage to the selected word line and a program pass voltage less than the program voltage to the unselected word lines.

A program verify operation and a read operation of the memory cell array 110 may be performed in units of pages. During a program verify operation, the row decoder 121 may apply a verify voltage to the selected word line and a verify pass voltage greater than the verify voltage to the unselected word lines. During a read operation, the row decoder 121 may apply a read voltage to the selected word line and a read pass voltage greater than the read voltage to the unselected word lines.

An erase operation of the memory cell array 110 may be performed in units of memory blocks. During an erase operation, the row decoder 121 may select one of the memory blocks according to the decoded address, and the row decoder 121 may apply a ground voltage to word lines coupled to the selected memory block.

The voltage generator 122 may operate in response to control of the control logic 130. More specifically, the voltage generator 122 may be configured to generate a plurality of voltages by using an external power voltage supplied to the memory device 100 in response to the control logic 130. For example, the voltage generator 122 may generate a program voltage, a verify voltage, a pass voltage, a read voltage, and an erase voltage in response to the control of the control logic 130. In other words, the voltage generator 122 may generate various operating voltages Vop for program, read and erase operations in response to an operation signal OPSIG.

For example, the voltage generator 122 may generate an internal power voltage by regulating an external power voltage. The internal power voltage generated by the voltage generator 122 may serve as an operating voltage of the memory cell array 110.

However, the voltage generator 122 may generate a plurality of voltages by using the external power voltage or the internal power voltage. For example, the voltage generator 122 may include a plurality of pumping capacitors receiving the internal power voltage and generate a plurality of voltages by selectively activating the plurality of pumping capacitors in response to control of the control logic 130. The plurality of generated voltages may be supplied to the memory cell array 110 by the row decoder 121.

The page buffer group 123 may include first to nth page buffers PB1 to PBn, which may be coupled to the memory cell array 110 through the first to nth bit lines BL1 to BLn, respectively. The first to nth page buffers PB1 to PBn may operate in response to the control of the control logic 130. More specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or may sense voltages or currents in the first to nth bit lines BL1 to BLn during a read or verify operation.

More specifically, during a program operation, the first to nth page buffers PB1 to PBn may transfer data DATA received through the input/output circuit 125 to selected memory cells through the first to nth bit lines BL1 to BLn when a program pulse is applied to a selected word line. Memory cells of the selected page may be programmed according to the transferred data DATA. A memory cell coupled to a bit line to which a program permission voltage (e.g., a ground voltage) is applied may have an increased threshold voltage. A threshold voltage of a memory cell coupled to a bit line to which a program inhibition voltage (for example, a power voltage) is applied may be maintained.

For example, during a program verify operation, the first to nth page buffers PB1 to PBn may read page data from the selected memory cells through the first to nth bit lines BL1 to BLn, respectively. During a read operation, the first to nth page buffers PB1 to PBn may read the data DATA from the memory cells of the selected page through the first to nth bit lines BL1 to BLn and may output the read data DATA to the input/output circuit 125 in response to control of the column decoder 124. During an erase operation, the first to nth page buffers PB1 to PBn may float the first to nth bit lines BL1 to BLn, respectively.

The column decoder 124 may transfer data between the input/output circuit 125 and the page buffer group 123 in response to a column address CADD. For example, the column decoder 124 may exchange data with the first to nth page buffers PB1 to PBn through data lines DL, or may exchange data with the input/output circuit 125 through column lines CL.

The input/output circuit 125 may transfer a command CMD and an address ADDR from the memory controller 200 to the control logic 130, or may exchange the data DATA with the column decoder 124.

A sensing circuit 126 may generate a reference current in response to an allowable bit signal VRYBIT and compare a sensing voltage VPB received from the page buffer group 123 with a reference voltage generated by the reference current to output a pass signal PASS or a fail signal FAIL during a read operation or a verify operation.

The control logic 130 may control the peripheral circuit 120 by outputting the operation signal OPSIG, the row address RADD, the page buffer control signals PBSIGNALS and the allowable bit signal VRYBIT in response to the command CMD and the address ADDR. In addition, the control logic 130 may determine whether a verify operation passes or fails in response to the pass or fail signal PASS or FAIL. According to an embodiment of the present disclosure, verify information including the pass or fail signal PASS or FAIL may be temporarily stored in the page buffer group 123.

Figure 3:
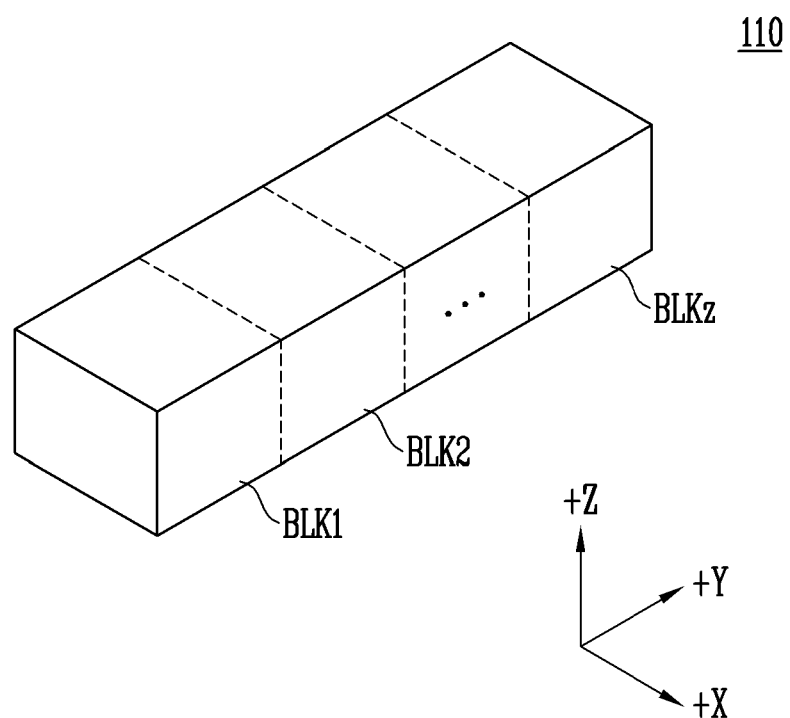
FIG. 3 is a diagram illustrating a memory cell array according to an embodiment of the present disclosure.

FIG. 3 is a block diagram illustrating the memory cell array 110 according to an embodiment of the present disclosure.

Referring to FIG. 3, the memory cell array 110 may include the plurality of memory blocks BLK1 to BLKz. Each memory block may have a three-dimensional structure and include a plurality of memory cells stacked over a substrate. The plurality of memory cells may be arranged in +X direction, +Y direction and +Z direction. The structure of each memory block is described below in more detail with reference to FIGS. 4 and 5.

Figure 4:
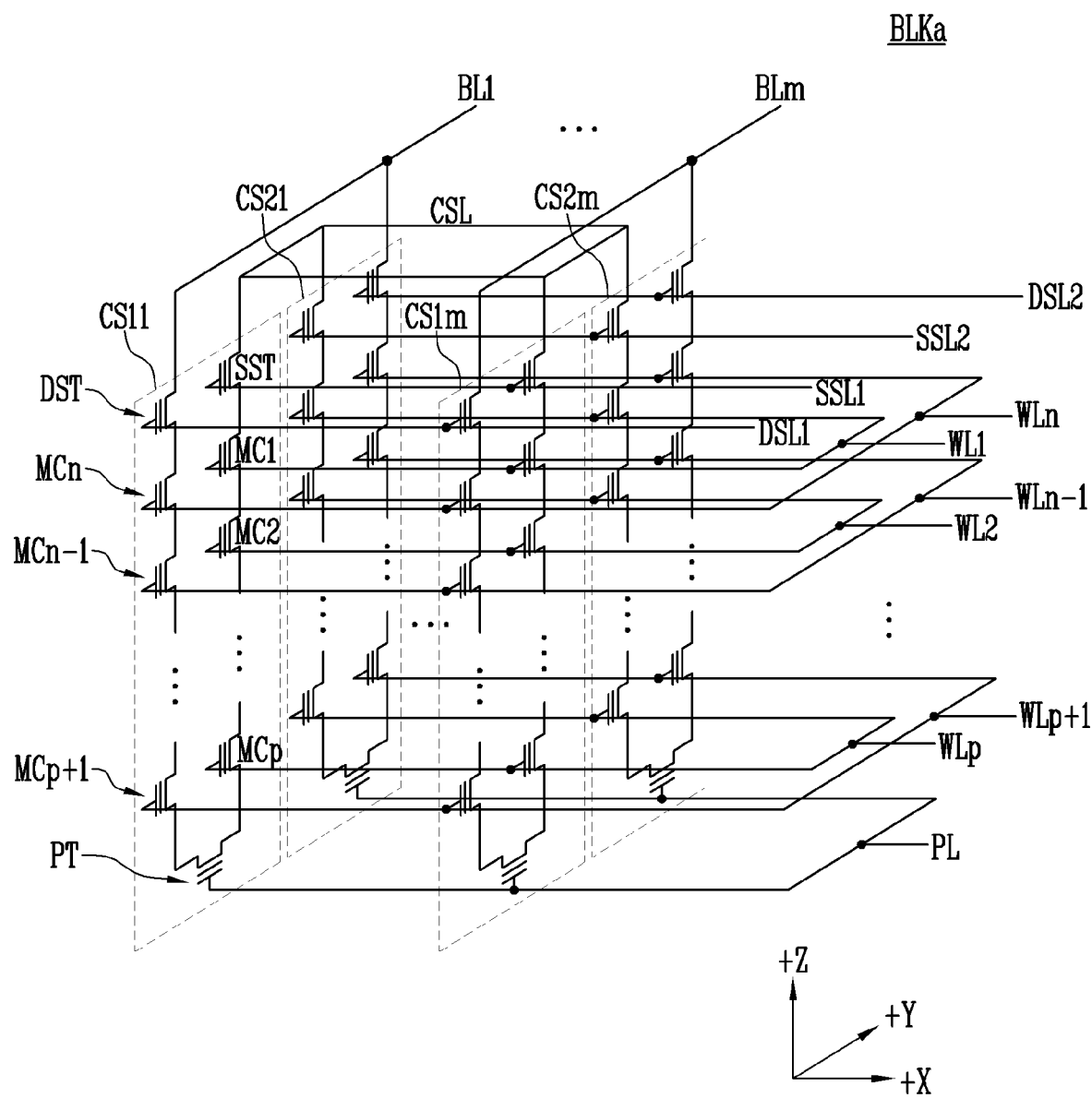
FIG. 4 is a block diagram illustrating a memory block according to an embodiment of the present disclosure.

FIG. 4 is a diagram illustrating a memory block according to an embodiment of the present disclosure.

Referring to FIG. 4, a representative memory (BLKa) of the memory blocks BLK1 to BLKz is shown. The memory block BLKa may include a plurality of cell strings CS11 to CS1$m$ and CS21 to CS2$m$. Each of the plurality of cell strings CS11 to CS1$m$ and CS21 to CS2$m$ may be formed in a 'U' shape. In the memory block BLKa, m cell strings may be arranged in a row direction (e.g., X direction).

According to an embodiment, the memory block BLKa may include a plurality of sub-blocks, and each of the sub-blocks may include the plurality of cell strings CS11 to CS1$m$ and CS21 to CS2$m$. For example, a first sub-block may include a plurality of first cell strings CS11 to CS1$m$ and a second sub-block may include a plurality of second cell strings CS21 to CS2$m$.

FIG. 4 illustrates two cell strings arranged in a column direction (i.e., +Y direction) for clarity. However, three or more cell strings may be arranged in the column direction.

According to an embodiment, each of the sub-blocks may include a plurality of select transistors and a plurality of memory cells. More specifically, each of the sub-blocks may include a plurality of cell strings. For example, the first sub-block may include the plurality of first cell strings CS11 to CS1$m$. Each of the first cell strings CS11 to CS1$m$ may include at least one source select transistor SST, first to nth memory cells MC1 to MCn, a pipe transistor PT, and at least one drain select transistor DST.

Each of the select transistors SST and DST and each of the memory cells MC1 to MCn may have similar structures to each other. According to an embodiment, each of the select transistors SST and DST and the memory cells MC1 to MCn may include a channel layer, a tunneling insulating layer, a charge storage layer, and a blocking insulating layer. According to an embodiment, a pillar for providing a channel layer may be provided in each cell string. According to an embodiment, a pillar for providing at least one of the channel layer, the tunneling insulating layer, the charge storage layer, and the blocking insulating layer may be provided to each cell string.

The source select transistor SST of each cell string may be coupled between a common source line CSL and first to pth memory cells MC1 to MCp. In addition, source select transistors of cell strings arranged in the same row may be coupled to a source select line extending in the row direction, and source select transistors of cell strings arranged in different rows may be coupled to different source select lines.

According to an embodiment of the present disclosure, the source select transistors SST of the first cell strings CS11 to CS1$m$ of the first sub-block may be coupled to a first source select line SSL1. In addition, the source select transistors SST of the second cell strings CS21 to CS2$m$ of the second sub-block may be coupled to a second source select line SSL2. In other words, the first sub-block and the second sub-block may be coupled to different source select lines (e.g., the first source select line SSL1 and the second source select line SSL2).

In addition, the first to nth memory cells MC1 to MCn of each cell string may be coupled between the source select transistor SST and the drain select transistor DST.

The first to nth memory cells MC1 to MCn may be divided into the first to pth memory cells MC1 to MCp and (p+1)th to nth memory cells MCp+1 to MCn. The first to pth memory cells MC1 to MCp may be sequentially arranged in a −Z direction and be coupled in series between the source select transistor SST and the pipe transistor PT. The (p+1)th to nth memory cells MCp+1 to MCn may be sequentially arranged in +Z direction and be coupled in series between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each cell string may be coupled to first to nth word lines WL1 to WLn, respectively.

A gate of the pipe transistor PT of each cell string may be coupled to a pipe line PL.

The drain select transistor DST of each cell string may be coupled between the corresponding bit line and the (p+1)th to nth memory cells MCp+1 to MCn. Cell strings arranged in the row direction may be coupled to a drain select line extending in the row direction.

According to an embodiment, the drain select transistors DST of the first cell strings CS11 to CS1$m$ of the first sub-block may be coupled to a first drain select line DSL1. In addition, the drain select transistors DST of the second cell strings CS21 to CS2$m$ of the second sub-block may be coupled to a second drain select line DSL2. In other words, the first sub-block and the second sub-block may be coupled to different drain select lines (e.g., the first drain select line DSL1 and the second drain select line DSL2).

Cell strings arranged in the column direction may be coupled to bit lines extending in the column direction. As shown in FIG. 4, the cell strings CS11 and CS21 in the first column may be coupled to the first bit line BL1. The cell strings CS1$m$ and CS2$m$ in the mth column may be coupled to the mth bit line BLm.

Memory cells coupled to the same word line, among the cell strings arranged in the row direction, may form a single page. For example, memory cells coupled to the first word line WL1 in the first cell strings CS11 to CS1$m$ of the first sub-block, may constitute one page. Memory cells coupled to the first word line WL1, in the second cell strings CS21 to CS2$m$ of the second sub-block, may constitute one page. When one of the drain select lines DSL1 and DSL2 is selected, one of the first and second sub-blocks may be selected. In addition, when one of the first and second sub-blocks is selected, the plurality of first cell strings CS11 to CS1$m$ or the plurality of second cell strings CS21 to CS2$m$ may be selected. In addition, by selecting one of the word lines WL1 to WLn, one page may be selected from the selected cell strings.

According to another embodiment, even bit lines and odd bit lines may replace first to mth bit lines BL1 to BLm. In addition, even cell strings of the cell strings CS11 to CS1$m$ or CS21 to CS2$m$ arranged in the row direction may be coupled to even bit lines, respectively, and odd cell strings of the cell strings CS11 to CS1$m$ or CS21 to CS2$m$ arranged in the row direction may be coupled to odd bit lines, respectively.

According to an embodiment, at least one of the first to nth memory cells MC1 to MCn may serve as a dummy memory cell. For example, one or more dummy memory cells may be provided to reduce an electric field between the source select transistor SST and the first to pth memory cells MC1 to MCp. Alternatively, one or more dummy memory cells may be provided to reduce an electric field between the drain select transistor DST and the memory cells MCp+1 to MCn. When more dummy memory cells are provided, the operational reliability of the memory block BLKa may be improved, whereas the size of the memory block BLKa may be increased. On the other hand, when less dummy memory cells are provided, the size of the memory block BLKa may be reduced, whereas the operational reliability of the memory block BLKa may be reduced.

In order to efficiently control dummy memory cell(s), each may have a required threshold voltage. Before or after an erase operation on the memory block BLKa, program operations may be performed on a portion or entirety of the dummy memory cells. When an erase operation is performed after a program operation is performed, dummy memory cells may have required threshold voltages by controlling voltages applied to dummy word lines coupled to the respective dummy memory cells.

Figure 5:
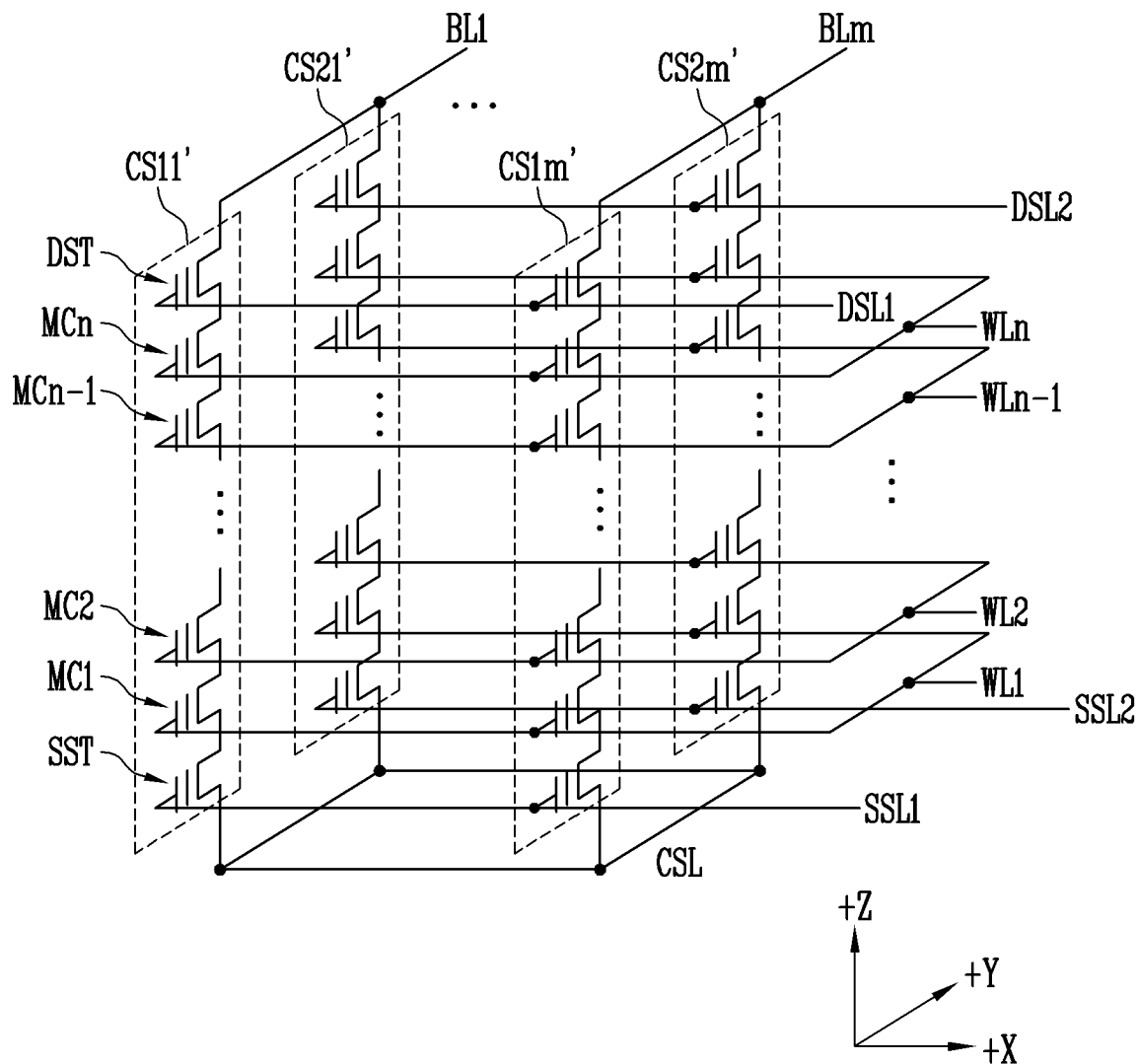
FIG. 5 is a diagram illustrating a memory block according to another embodiment of the present disclosure.

FIG. 5 is a block diagram illustrating a memory block BLKb according to an embodiment of the present disclosure.

Referring to FIG. 5, one memory (BLKb) among the memory blocks BLK1 to BLKz as shown in FIG. 3 is shown. According to an embodiment, the memory block BLKb may include a plurality of sub-blocks. Each of the sub-blocks may include a plurality of cell strings CS11' to CS1$m$' and CS21' to CS2$m$'. More specifically, a first sub-block may include a plurality of first cell strings CS11' to CS1$m$' among the plurality of cell strings and a second sub-block may include a plurality of second cell strings CS21' to CS2$m$' among the plurality of cell strings.

In addition, each of the plurality of cell strings CS11' to CS1$m$' and CS21' to CS2$m$' may extend in the +Z direction. Each of the first and second sub-blocks may include at least one source select transistor SST, the first to nth memory cells MC1 to MCn, and at least one drain select transistor DST which are stacked on a substrate (not shown) under the memory block BLKb.

The source select transistor SST of each cell string may be coupled between the common source line CSL and the first to nth memory cells MC1 to MCn. Source select transistors of cell strings arranged in the same row may be coupled to the same source select line. The source select transistors SST of the first cell strings CS11' to CS1$m$' included in the first sub-block may be coupled to the first source select line SSL1. The source select transistors SST of the second cell strings CS21' to CS2$m$' included in the second sub-block may be coupled to the second source select line SSL2. According to another embodiment, the source select transistors of the cell strings CS11' to CS1$m$' and CS21' to CS2$m$' may be commonly coupled to a single source select line.

The first to nth memory cells MC1 to MCn of each cell string may be coupled between the source select transistor SST and the drain select transistor DST. Gates of the first to nth memory cells MC1 to MCn may be coupled to the first to nth word lines WL1 to WLn, respectively.

The drain select transistor DST of each cell string may be coupled between the corresponding bit line and the memory cells MC1 to MCn. Drain select transistors of cell strings arranged in the row direction may be coupled to a drain select line extending in the row direction. The drain select transistors DST of the first cell strings CS11' to CS1$m$' of the first sub-block may be coupled to the first drain select li ne DSL1. The drain select transistors DST of the second cell strings CS21' to CS2$m$' of the second sub-block may be coupled to the second drain select line DSL2.

As a result, the memory block BLKb shown in FIG. 5 may have a circuit equivalent or similar to the memory block BLKa shown in FIG. 4 except that the pipe transistor PT is removed from each cell string of the memory block BLKb.

According to another embodiment, even bit lines and odd bit lines may replace the first to mth bit lines BL1 to BLm. In addition, even cell strings of the cell strings CS11' to CS1$m$' or CS21' to CS2$m$' arranged in the row direction may be coupled to even bit lines, respectively, and odd cell strings of the cell strings CS11' to CS1$m$' or CS21' to CS2$m$' arranged in the row direction may be coupled to odd bit lines, respectively.

According to an embodiment, at least one of the first to nth memory cells MC1 to MCn may serve as a dummy memory cell. For example, one or more dummy memory cells may be provided to reduce an electric field between the source select transistor SST and the memory cells MC1 to MCn. Alternatively, one or more dummy memory cells may be provided to reduce an electric field between the drain select transistor DST and the memory cells MC1 to MCn. When more dummy memory cells are provided, the operational reliability of the memory block BLKb may be improved, whereas the size of the memory block BLKb may be increased. On the other hand, when fewer memory cells are provided, the size of the memory block BLKb may be reduced, whereas the operational reliability of the memory block BLKb may be degraded.

In order to efficiently control dummy memory cell(s), each may have a required threshold voltage. Before or after an erase operation on the memory block BLKb, program operations may be performed on a portion or entirety of the dummy memory cells. When an erase operation is performed after a program operation is performed, dummy memory cells may have required threshold voltages by controlling voltages applied to dummy word lines coupled to the respective dummy memory cells.

Figure 6:
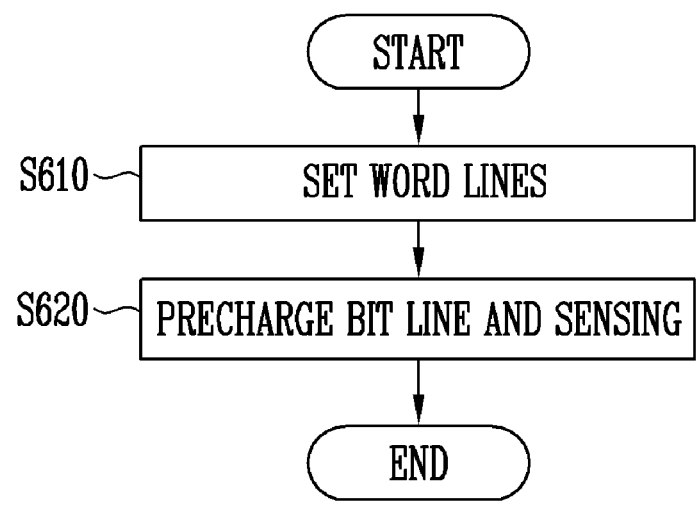
FIG. 6 is a flowchart illustrating a read operation according to an embodiment of the present disclosure.
Figure 7:
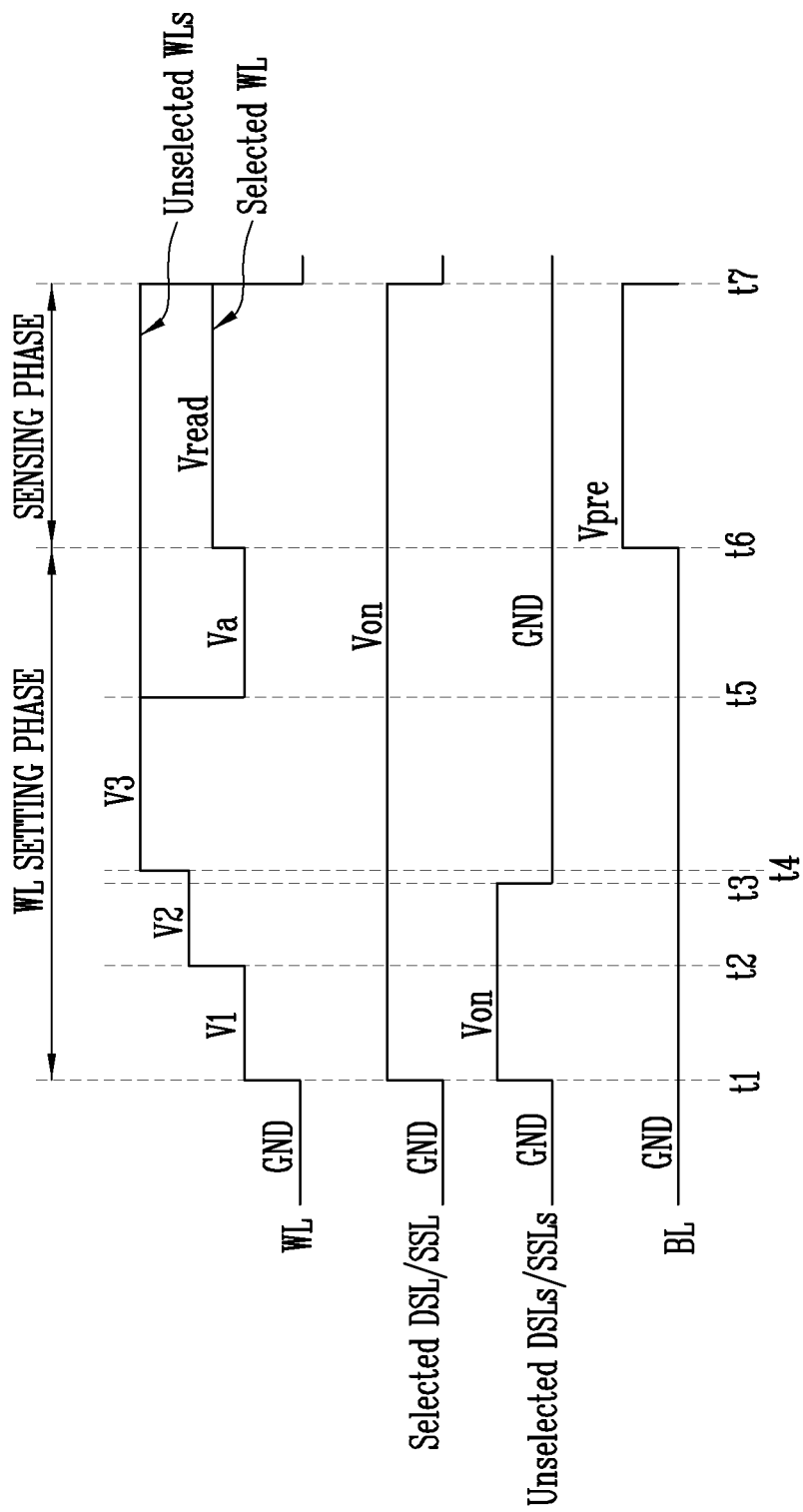
FIG. 7 is a timing chart illustrating a read operation according to an embodiment of the present disclosure.

FIG. 6 is a flowchart illustrating a read operation according to an embodiment of the present disclosure. FIG. 7 is a timing chart illustrating a read operation according to an embodiment of the present disclosure.

According to an embodiment, a memory device may include a plurality of sub-blocks, each of which may be coupled to the common source line CSL and bit lines BL. A plurality of memory cells included in each of the sub-blocks may be coupled by a plurality of word lines.

At operation S610, a memory device may set a plurality of word lines. More specifically, the memory device may control a peripheral circuit to set a voltage level of the plurality of word lines. At operation S620, the memory device may precharge the bit line BL and perform a sensing operation of sensing stored data on the basis of threshold voltages of the memory cells.

Referring to FIG. 7, a read operation may include a word line setting phase from a first time t1 to a sixth time t6 and a sensing phase after the sixth time t6. The word line setting phase may include setting a voltage level of a plurality of word lines. Each of the times t1 to t7 represents a discrete time point.

First, at the first time t1, when the plurality of word lines have a first voltage level V1, the memory device may apply a turn-on voltage Von to select lines included in each of the sub-blocks so as to turn on the transistors associated with those word lines. The select lines may include a first select line (Selected DSL/SSL) coupled to a sub-block subject to a read operation and second select lines (Unselected DSLs/SSLs) coupled to a sub-block which is not subject to the read operation.

At a second time t2, the memory device may increase the voltage level of the plurality of word lines from the first voltage level V1 to a second voltage level V2. Respective distances between the plurality of word lines and a point where a voltage is supplied may be different. In addition, a word line far away from the point where the voltage is supplied (WL_far) and a word line close to the point where the voltage is supplied (WL_near) may take different times to reach the same voltage level even when the memory device the same word line voltage I thereto. More specifically, the word line WL_far and the word line WL_near may have different voltage levels between the second time t2 and the third time t3. Therefore, the memory device may supply the word line voltage to the plurality of word lines until a voltage level of a word line farthest away from the point where the voltage is supplied reaches the second voltage level V2.

At a third time t3, the memory device may apply a turn-off voltage (e.g., a ground voltage) to the second select lines (Unselected DSLs/SSLs) when a set condition is satisfied. The condition may pertain to the voltage level of the word line farthest away from the point where the voltage is supplied, and the condition may be satisfied when the voltage level of the farthest away word line reaches the second voltage level V2. Alternatively, the condition may pertain to the number of word lines having the second voltage level V2, and in this case the condition may be satisfied when a threshold number or more of word lines have the second voltage level V2. The memory device may turn off the plurality of select transistors which are not subject to the read operation by applying the turn-off voltage (e.g., a ground voltage) to the second select lines, i.e., Unselected DSLs/SSLs.

At a fourth time t4, the memory device may increase the voltage level of the plurality of word lines from the second voltage level V2 to a third voltage level V3. The third voltage level V3 may be a pass voltage by which the memory cells in the memory device are turned on regardless of threshold voltages.

When the voltage level of the plurality of word lines increases to the third voltage level V3, a channel corresponding to a sub-block which is not subject to a read operation may be boosted by the turned-off select transistors. The memory device may boost a channel corresponding to the sub-block which is not subject to the read operation by increasing the voltage level of the plurality of word lines to the third voltage level V3 when the plurality of select transistors coupled to the second select lines, i.e., Unselected DSLs/SSLs, are turned off.

At a fifth time t5, the memory device may decrease the voltage level of the selected word line from the third voltage level V3 to the first voltage level V1. Alternatively, the memory device may decrease the voltage level of the selected word line to an arbitrary voltage level (Va) between a ground voltage level GND and a read voltage level Vread.

In addition, at the sixth time t6, the memory device may precharge the bit lines BL to a precharge voltage level Vpre and increase the voltage level of the selected word line to the read voltage level Vread. In other words, the memory device may perform the sensing phase by controlling the bit lines BL and the plurality of word lines after the sixth time t6.

Figure 8:
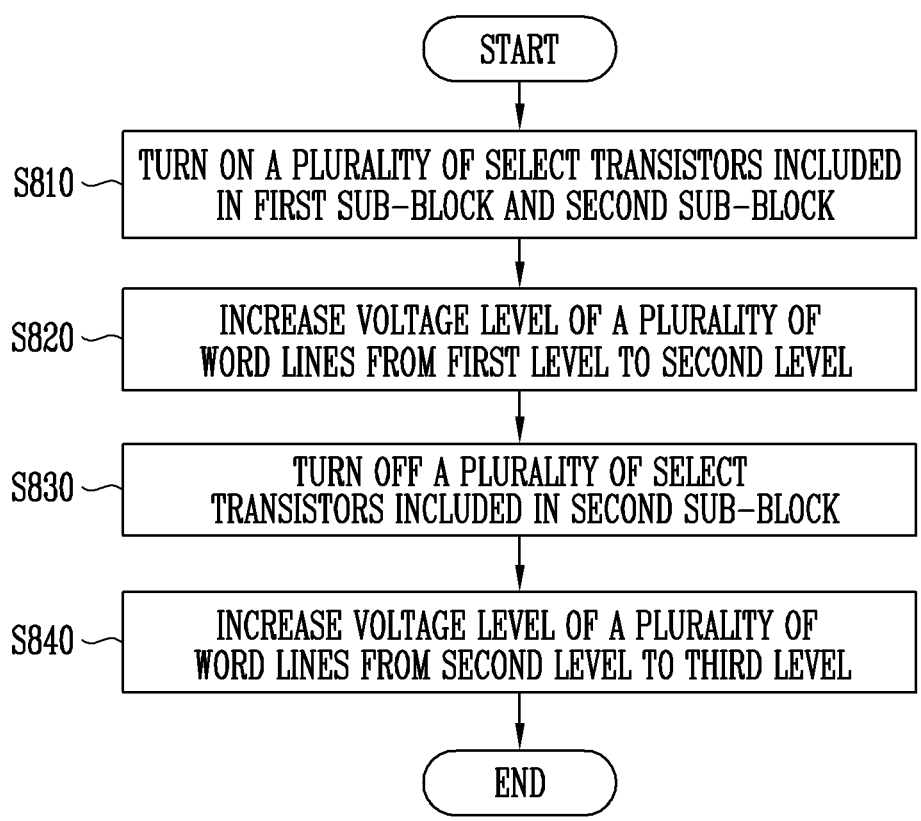
FIG. 8 is a flowchart illustrating a method of operating a memory device according to an embodiment of the present disclosure.

FIG. 8 is a flowchart illustrating a method of operating a memory device according to an embodiment of the present disclosure.

According to an embodiment, a memory device may include a first sub-block and a second sub-block. In addition, the first sub-block may include a plurality of first select transistors and a plurality of first memory cells. The second sub-block may be coupled to the first sub-block through a plurality of word lines and include a plurality of second select transistors and a plurality of second memory cells.

A method of operating the memory device to perform a read operation on the first sub-block may include performing a setting phase on the plurality of word lines and performing a sensing phase on stored data as described above with reference to FIG. 6.

First, at operation S810, the memory device may turn on the plurality of select transistors included in the first sub-block and the second sub-block. The first sub-block may include the plurality of first select transistors (e.g., at least one first source select transistor and at least one first drain select transistor). The second sub-block may include the plurality of second select transistors (e.g., at least one second source select transistor and at least one second drain select transistor). More specifically, the memory device may turn on the plurality of first select transistors and the plurality of second select transistors by applying a turn-on voltage to the first source select line, the second drain select line, the second source select line, and the second drain select line.

At operation S820, the memory device may increase a voltage level of the plurality of word lines from a first level to a second level. More specifically, the memory device may apply a voltage to the plurality of word lines so that a voltage level of a word line farthest away from a point where the voltage is supplied, among the plurality of word lines, may reach the second level.

At operation S830, the memory device may turn off the plurality of select transistors included in the second sub-block. More specifically, the memory device may turn off the plurality of second select transistors (e.g., at least one second source select transistor and at least one second drain select transistor) by applying a turn-off voltage to the second source select line and the second drain select line. The memory device may put a channel corresponding to the second sub-block into a floating state by turning off the plurality of second select transistors.

At operation S840, the memory device may increase the voltage level of the plurality of word lines from the second level to a third level. In the memory device, when the voltage level of the plurality of word lines increases from the second level to the third level with the channel corresponding to the second sub-block floated, the channel corresponding to the second sub-block may be boosted by a coupling phenomenon with a channel corresponding to the first sub-block.

The memory device may subsequently apply a read voltage to the selected word line among the plurality of word lines. More specifically, the memory device may increase the voltage level of the plurality of word lines to the third level and may then decrease a voltage level of the selected word line to a read voltage level. Alternatively, the memory device may increase the voltage level of the plurality of word lines to the third level, decrease the voltage level of the selected word line from the third level to the first level, and then increase the voltage level of the selected word line from the first level to the read voltage level.

After operations S810 to S840 are performed, the memory device may perform the sensing operation of applying a precharge voltage to a plurality of bit lines coupled to the first sub-block and sensing data stored based on a threshold voltage of a memory cell.

Figure 9:
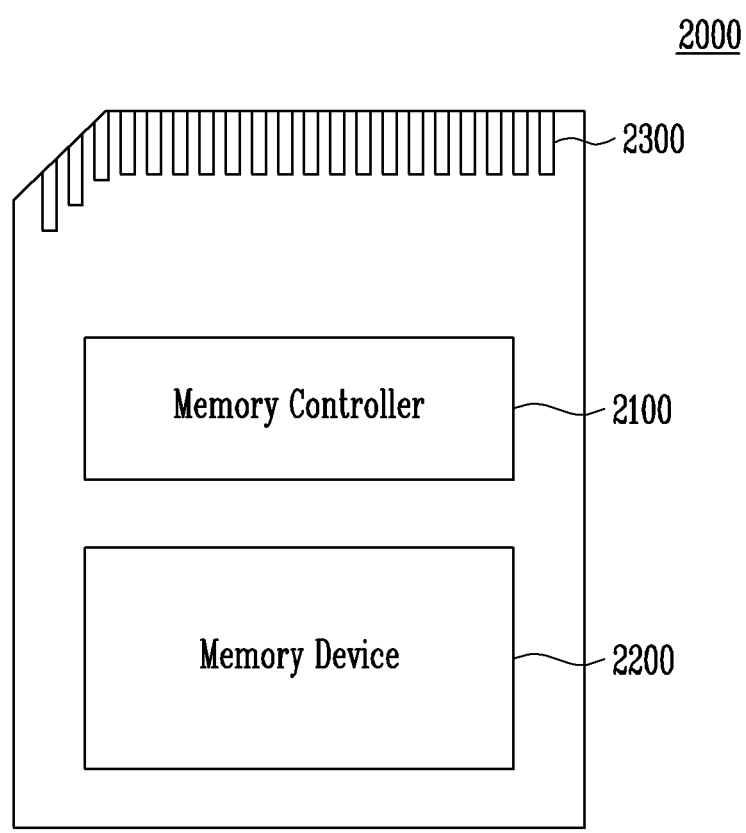
FIG. 9 is a diagram illustrating a card system according to an embodiment of the present disclosure.

FIG. 9 is a diagram illustrating a memory card system 2000 according to an embodiment of the present disclosure.

Referring to FIG. 9, the memory card system 2000 may include a memory controller 2100, a memory device 2200 and a connector 2300.

The memory controller 2100 may be electrically coupled to the memory device 2200. The memory controller 2100 may be configured to access the memory device 2200. For example, the memory controller 2100 may control read, write, erase, and background operations of the memory device 2200. The memory controller 2100 may be configured to provide an interface between the memory device 2200 and a host. In addition, the memory controller 2100 may be configured to drive firmware for controlling the memory device 2200.

For example, the memory controller 2100 may include components, such as a Random Access Memory (RAM), a processing unit, a host interface, a memory interface, and an ECC block.

The memory controller 2100 may communicate with an external device through the connector 2300. The memory controller 2100 may communicate with an external device (e.g., the host) based on a specific communication protocol. For example, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and/or nonvolatile memory express (NVMe) protocols. For example, the connector 2300 may be defined by at least one of the above-described various communication protocols.

In an embodiment, the memory device 2200 may be embodied as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), and a Spin-Torque Magnetic RAM (STT-MRAM).

The memory controller 2100 and the memory device 2200 may be integrated into a single semiconductor device to form a memory card, such as a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), and/or a universal flash storage (UFS).

Figure 10:
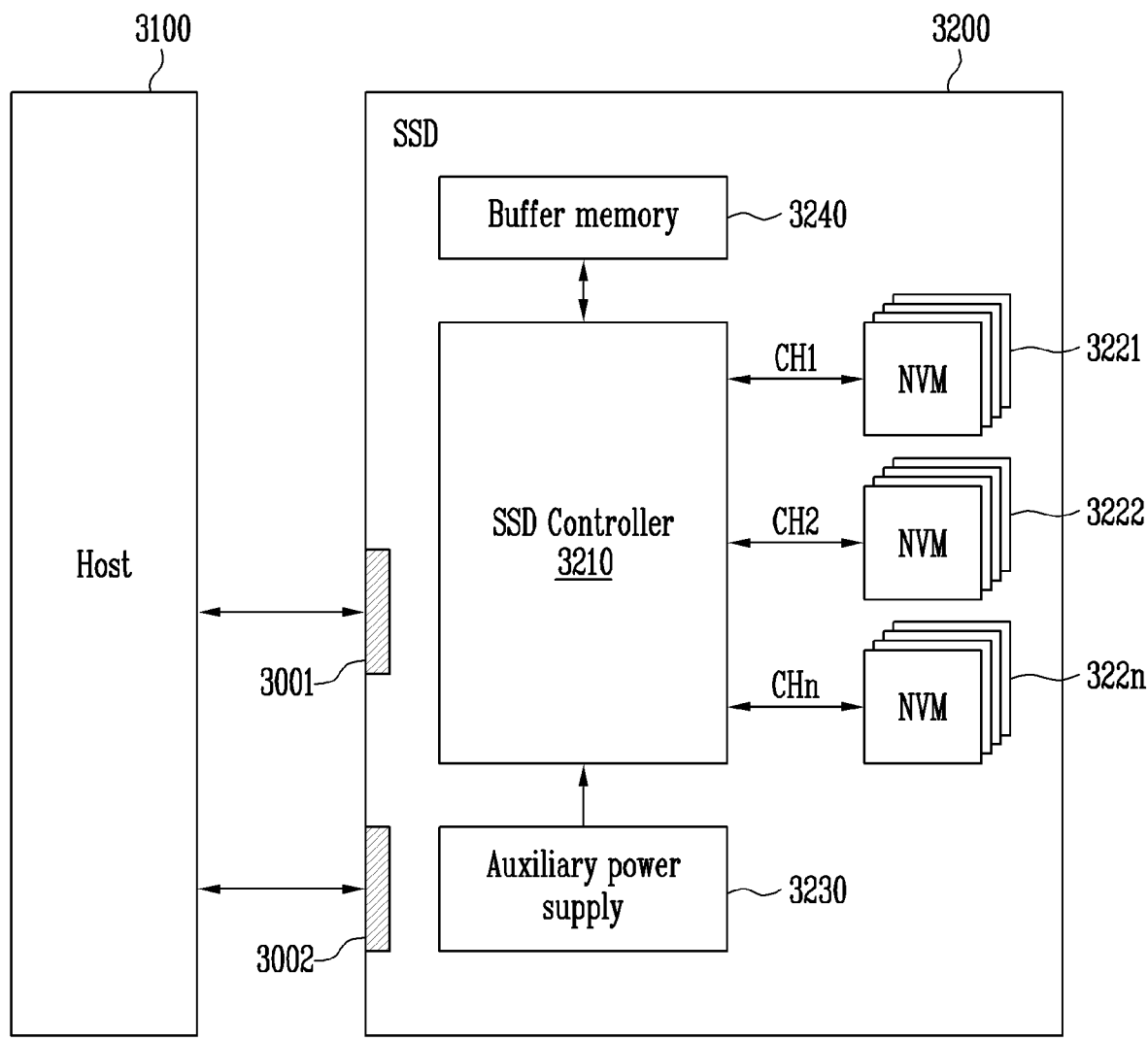
FIG. 10 is a diagram illustrating a solid state drive (SSD) system according to an embodiment of the present disclosure.

FIG. 10 is a diagram illustrating a solid state drive (SSD) system 3000 according to an embodiment of the present disclosure.

Referring to FIG. 10, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

According to an embodiment, the SSD controller 3210 may perform the function of the memory controller 200 described above with reference to FIG. 1. The SSD controller 3210 may control the plurality of flash memories 3221 to 322n in response to the signals SIG received from the host 3100. For example, the signals SIG may be based on the interfaces of the host 3100 and the SSD 3200. For example, the signals SIG may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and/or nonvolatile memory express (NVMe) interfaces.

The auxiliary power supply 3230 may be coupled to the host 3100 through the power connector 3002. The auxiliary power supply 3230 may be supplied and charged with the power PWR from the host 3100. The auxiliary power supply 3230 may supply the power of the SSD 3200 when power is not smoothly supplied from the host 3100. According to an embodiment, the auxiliary power supply 3230 may be positioned inside or outside the SSD 3200. For example, the auxiliary power supply 3230 may be disposed on a main board and may supply auxiliary power to the SSD 3200.

The buffer memory 3240 may function as a buffer memory of the SSD 3200. For example, the buffer memory 3240 may temporarily store data received from the host 3100 or data received from the plurality of flash memories 3221 to 322n, or may temporarily store metadata (e.g., mapping tables) of the flash memories 3221 to 322n. The buffer memory 3240 may include volatile memories, such as DRAM, SDRAM, DDR SDRAM, LPDDR SDRAM, and/or GRAM, or nonvolatile memories such as FRAM, ReRAM, STT-MRAM, and/or PRAM.

Figure 11:
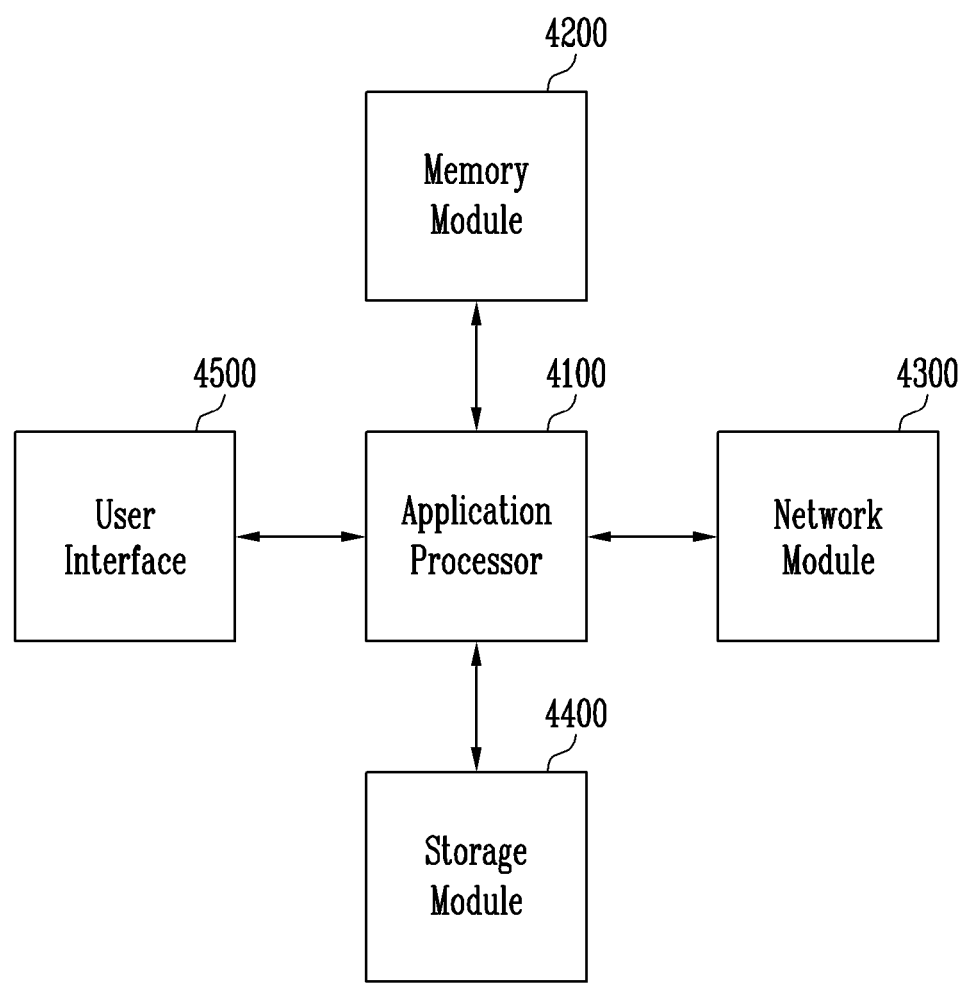
FIG. 11 is a diagram illustrating a user system according to an embodiment of the present disclosure.

FIG. 11 is a diagram illustrating a user system 4000 according to an embodiment of the present disclosure.

Referring to FIG. 11, the user system 4000 may include an application processor 4100, a memory module 4200, a network module 4300, a storage module 4400, and a user interface 4500.

The application processor 4100 may run components included in the user system 4000, an operating system (OS), or a user program. For example, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR2 SDRAM, and/or LPDDR3 SDRAM, or nonvolatile RAMs such as PRAM, ReRAM, MRAM, and/or FRAM. For example, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. For example, the network module 4300 may be included in the application processor 4100.

The storage module 4400 may store data. For example, the storage module 4400 may store data received from the application processor 4100. The storage module 4400 also may transmit the data stored in the storage module 4400 to the application processor 4100. For example, the storage module 4400 may be embodied as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. For example, the storage module 4400 may be provided as a removable storage medium (i.e., removable drive), such as a memory card or an external drive of the user system 4000.

For example, the storage module 4400 may include a plurality of nonvolatile memory devices, each of which may be operated in the same manner as the memory device described above with reference to FIGS. 1 to 8. The storage module 4400 may operate in the same manner as the storage device 1000 described above with reference to FIG. 1.

The user interface 4500 may include any of various interfaces which input data or instructions to the application processor 4100 or output data to an external device. According to an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and/or a monitor.

According to embodiments of the present disclosure, a memory device having improved read operation characteristics and a method of operating the memory device may be provided.

In the above-discussed embodiments, not all operations need necessarily be performed. In some cases, one or more operations may be omitted. In some cases, one or more operations may be performed in different order than that disclosed. In general, the disclosed embodiments aim to help those skilled in this art more clearly understand the present disclosure, not to limit the bounds of the present invention. In other words, one skilled in the art will be able to easily understand in view of the teachings herein that various modifications are possible without departing from the spirit or scope of the invention. Thus, it is intended that the present invention cover all such modifications that fall within the scope of the appended claims and their equivalents.

What is claimed is:

1. A memory device, comprising:
a first sub-block including a plurality of first select transistors and a plurality of first memory cells;
a second sub-block coupled to the first sub-block through a plurality of word lines and including a plurality of second select transistors and a plurality of second memory cells;
a peripheral circuit configured to perform a read operation on data stored in the first sub-block or the second sub-block; and
a control logic configured to control the peripheral circuit to apply a read voltage to a selected word line among the plurality of word lines,
wherein, when the read operation is performed on the first sub-block, the control logic controls the peripheral circuit to:
turn on the plurality of first select transistors and the plurality of second select transistors,
increase a voltage level of the plurality of word lines from a first level to a second level,
turn off the plurality of second select transistors when the voltage level of the plurality of word lines reaches the second level, and
increase the voltage level of the plurality of word lines from the second level to a third level.

2. The memory device of claim 1, wherein, after increasing the voltage level of the plurality of word lines to the third level, the control logic controls the peripheral circuit to decrease the voltage level of the selected word line to a read voltage level.

3. The memory device of claim 1, wherein, after increasing the voltage level of the plurality of word lines to the third level, the control logic controls the peripheral circuit to:
decrease the voltage level of the selected word line from the third level to the first level, and increase the voltage level of the selected word line to a read voltage level.

4. The memory device of claim 1, wherein the control logic controls the peripheral circuit to apply a precharge voltage to a plurality of bit lines coupled to the first sub-block after increasing the voltage level of the plurality of word lines to the third level.

5. The memory device of claim 1, wherein the first level is a voltage level greater than 0 V.

6. The memory device of claim 1, wherein the third level is a voltage level for turning on the plurality of memory cells.

7. The memory device of claim 1, wherein the control logic controls the peripheral circuit to turn off the second select transistors included in the second sub-block when the voltage level of a word line farthest away from a point where a voltage is supplied, among the plurality of word lines, reaches the second level.

8. A method of operating a memory device including a first sub-block including a plurality of first select transistors and a plurality of first memory cells, and a second sub-block coupled to the first sub-block through a plurality of word lines and including a plurality of second select transistors and a plurality of second memory cells, the memory device performing a read operation on the first sub-block, the method comprising:
turning on the plurality of first select transistors and the plurality of second select transistors;
increasing a voltage level of the plurality of word lines from a first level to a second level;
turning off the plurality of second select transistors; and
increasing the voltage level of the plurality of word lines from the second level to a third level.

9. The method of claim 8, further comprising applying a read voltage to a selected word line among the plurality of word lines.

10. The method of claim 9, wherein the applying of the read voltage comprises decreasing the voltage level of the selected word line to a read voltage level after increasing the voltage level of the plurality of word lines to the third level.

11. The method of claim 9, wherein the applying of the read voltage comprises:
decreasing the voltage level of the selected word line to the first level after increasing the voltage level of the plurality of word lines to the third level, and
increasing the voltage level of the selected word line to a read voltage level after decreasing the voltage level of the selected word line to the first level.

12. The method of claim 8, further comprising applying a precharge voltage to a plurality of bit lines coupled to the first sub-block after increasing the voltage level of the plurality of word lines to the third level.

13. The method of claim 8, wherein the first level is a voltage level greater than 0 V.

14. The method of claim 8, wherein the third level is a voltage level for turning on the plurality of first memory cells and the plurality of second memory cells.

15. A memory device, comprising:
a first sub-block including a plurality of first select transistors and a plurality of first memory cells;
a second sub-block coupled to the first sub-block through a plurality of word lines and including a plurality of second select transistors and a plurality of second memory cells; and
a peripheral circuit performing a read operation on data stored in the first sub-block or the second sub-block,
wherein, in configured to perform the read operation, the peripheral circuit turns on the plurality of first select transistors and the plurality of second select transistors, increases a voltage level of the plurality of word lines in stepwise increments including at least two stepped increases, and turns off the plurality of second select transistors when the voltage level of the plurality of word lines reaches a target voltage level.

16. The memory device of claim 15, wherein, in performing the read operation, the peripheral circuit decreases a voltage level of the selected word line to a read voltage level after increasing the voltage level of the plurality of word lines in stepwise increments.

17. The memory device of claim 15, wherein, in performing the read operation, the peripheral circuit decreases a voltage level of the selected word line to a ground voltage level and increases the voltage level of the selected word line from the ground voltage level to a read voltage level after increasing the voltage level of the plurality of word lines in stepwise increments.

18. The memory device of claim 15, wherein, in performing the read operation, the peripheral circuit applies a precharge voltage to a plurality of bit lines coupled to the first sub-block after increasing the voltage level of the plurality of word lines in stepwise increments.

19. The memory device of claim 15, wherein, in performing the read operation, the peripheral circuit increases the voltage level of the plurality of word lines to a pass voltage level in one of the stepwise increments, the pass voltage level for turning on the plurality of first memory cells and the plurality of second memory cells.

20. The memory device of claim 15, wherein the peripheral circuit turns off the plurality of second select transistors when the voltage level of a word line farthest away from a point where a voltage is supplied, among the plurality of word lines, reaches the target voltage level.

* * * * *